US008435833B2

(12) United States Patent
Linares (10) Patent No.: US 8,435,833 B2
(45) Date of Patent: May 7, 2013

(54) GALLIUM NITRIDE LIGHT EMITTING DEVICES ON DIAMOND

(75) Inventor: Robert C. Linares, Sherborn, MA (US)

(73) Assignee: Apollo Diamond, Inc., Framingham, MA (US)

( * ) Notice: Subject to any disclaimer, the term of this patent is extended or adjusted under 35 U.S.C. 154(b) by 0 days.

(21) Appl. No.: 13/410,693

(22) Filed: Mar. 2, 2012

(65) Prior Publication Data
US 2012/0164786 A1 Jun. 28, 2012

Related U.S. Application Data

(63) Continuation of application No. 11/275,748, filed on Jan. 26, 2006, now Pat. No. 8,129,733.

(60) Provisional application No. 60/647,210, filed on Jan. 26, 2005.

(51) Int. Cl.
*H01L 21/00* (2006.01)

(52) U.S. Cl.
USPC .................................. 438/105; 257/E21.049

(58) Field of Classification Search .................. 438/105, 438/198, 518, 520, 932, 938; 257/E21.005, 257/E21.041, E21.043, E21.049
See application file for complete search history.

(56) References Cited

U.S. PATENT DOCUMENTS

| 5,132,749 A * | 7/1992 | Nishibayashi et al. ......... 257/77 |
| 5,306,662 A | 4/1994 | Nakamura |
| 5,373,171 A | 12/1994 | Imai et al. |
| 5,637,146 A | 6/1997 | Chyi |
| 6,087,274 A | 7/2000 | Tonucci et al. |
| 6,562,127 B1 | 5/2003 | Kud et al. |
| 8,129,733 B2 | 3/2012 | Linares |
| 2002/0064906 A1 | 5/2002 | Enquist |
| 2004/0227144 A1 | 11/2004 | Hon |
| 2005/0118349 A1 * | 6/2005 | Whitehead et al. ........... 427/523 |
| 2006/0211222 A1 | 9/2006 | Linares |

FOREIGN PATENT DOCUMENTS

| EP | 0730044 A2 | 9/1996 |
| JP | 06-151331 | 5/1994 |
| JP | 11-026383 | 1/1999 |
| WO | WO-0073543 A1 | 12/2000 |
| WO | WO-2006081348 A1 | 8/2006 |

OTHER PUBLICATIONS

An English-Chinese Dictionary of Science and Technology, (1995), 3 pgs.

(Continued)

*Primary Examiner* — Chandra Chaudhari
(74) *Attorney, Agent, or Firm* — Schwegman, Lundberg & Woessner, P.A.

(57) ABSTRACT

Wide bandgap devices are formed on a diamond substrate, such as for light emitting diodes as a replacement for incandescent light bulbs and fluorescent light bulbs. In one embodiment, diodes (or other devices) are formed on diamond in at least two methods. A first method comprises growing a wide bandgap material on diamond and building devices on that grown layer. The second method involves bonding a wide bandgap layer (device or film) onto diamond and building the device onto the bonded layer. These devices may provide significantly higher efficiency than incandescent or fluorescent lights, and provide significantly higher light or energy density than other technologies. Similar methods and structures result in other wide bandgap semiconductor devices.

21 Claims, 6 Drawing Sheets

OTHER PUBLICATIONS

"U.S. Appl. No. 11/275,748, Final Office Action mailed Apr. 15, 2009", 16 pgs.

"U.S. Appl. No. 11/275,748, Response filed Oct. 7, 2011 to Non Final Office Action mailed Apr. 7, 2011", 8 pgs.

"U.S. Appl. No. 11/275,748, Non Final Office Action mailed Apr. 7, 2011", 12 pgs.

"U.S. Appl. No. 11/275,748, Non Final Office Action mailed Sep. 30, 2008", 13 pgs.

"U.S. Appl. No. 11/275,748, Non-Final Office Action mailed Jan. 14, 2010", 15 pgs.

"U.S. Appl. No. 11/275,748, Notice of Allowance mailed Nov. 3, 2011", 9 pgs.

"U.S. Appl. No. 11/275,748, Pre-Appeal Brief Request filed Oct. 15, 2009", 4 pgs.

"U.S. Appl. No. 11/275,748, Response filed Mar. 18, 2009 to Non-Final Office Action mailed Sep. 30, 2008", 23 pgs.

"U.S. Appl. No. 11/275,748, Response filed Feb. 14, 2011 to Non Final Office Action mailed Jan. 14, 2010", 15 pgs.

"U.S. Appl. No. 11/275,748, Response filed Jul. 24, 2008 to Restriction Requirement mailed May 21, 2008", 1 pg.

"U.S. Appl. No. 11/275,748, Restriction Requirement mailed May, 21, 2008", 5 pgs.

"U.S. Appl. No. 11/275,748, Appeal Brief Filed Dec. 15, 2009", 19 pgs.

"Chinese Application Serial No. 200680008040.4, Office Action mailed Dec. 14, 2009", 6 pgs.

"Chinese Application Serial No. 200680008040.4, Response filed May 21, 2010 to Office Action mailed Dec. 14, 2009", 35 pgs.

"Epitaxy", Wikipedia (r), [online]. [retrieved May 21, 2010]. Retrieved from the Internet: <URL: http://en.wikipedia.org/wiki/Epitaxy, 3 pgs.

"European Application Serial No. 06719567.7, Communication mailed Dec. 28, 2007", 3 pgs.

"European Application Serial No. 06719567.7, Office Action mailed Nov. 30, 2010", 4 pgs.

"European Application Serial No. 06719567.7, Response filed Aug. 27, 2008 to Communication mailed Dec. 28, 2007", 15 pgs.

"Gallium Nitride", (r) Wikipedia, [online]. [retrieved May 21, 2010]. Retrieved from the Internet: <URL: http://en.wikipedia.org/wiki/Gallium_nitride>, 3 pgs.

"PCT Application Serial No. PCT/US2006/002755, International Preliminary Report on Patentability mailed Aug. 9, 2007", 7 pgs.

"PCT Application Serial No. PCT/US2006/002755, International Search Report mailed Jun. 16, 2006", 4 pgs.

Hageman, P. R, et al., "GaN growth on single-crystal diamond substratesby meatlorganic chemical vapour deposition and hydride vapour deposition", Thin Solid Films, 443(1-2), (2003), 9-13.

Tong, Q. Y., et al., "Layer Splitting Process in Hydrogen-Implanted Si, Ge, SiC, and Diamond Substrates", Appl. Phys. Lett. 70 American Institute of Physics, (Mar. 17, 1997), 1390-1392.

* cited by examiner

Fig. 10

GALLIUM NITRIDE LIGHT EMITTING DEVICES ON DIAMOND

CLAIM OF PRIORITY

This application is a continuation of and claims the benefit of priority under 35 U.S.C. §120 to U.S. patent application Ser. No. 11/275,748, filed on Jan. 26, 2006, entitled "GALLIUM NITRIDE LIGHT EMITTING DEVICES ON DIAMOND," which claims the benefit of priority under 35 U.S.C. §119(e) to U.S. Provisional Patent Application Ser. No. 60/647,210, filed Jan. 26, 2005, the benefit of priority of each of which is claimed hereby, and each of which are incorporated by reference herein in its entirety.

BACKGROUND

Light for residential and industrial lighting is generally provided by incandescent or fluorescent lights. Such lights generally consume significant power, are inefficient, and can also produce undesired heat. One potential replacement for such lights may be the use of gallium nitride light emitting diodes (LEDs). Gallium nitride devices may be formed by growing a gallium nitride film on silicon, sapphire, spinel or silicon carbide. A p-type layer and a n-type layer are grown with appropriate doping, contacts are formed by known methods and light emission is obtained by application of a suitable voltage. The gallium nitride layer may be alloyed with aluminum or indium to adjust the output wavelength to be appropriate for the particular application. Light output is typically in the violet, ultraviolet, blue or green regions of the spectrum.

Typically the light output from a gallium nitride LED is monochromatic and is unsuitable for white lighting. To obtain a white light output, the LED is coated with a phosphor which absorbs the monochromatic LED output and converts the light to broadband white light. These devices are already appearing in the market, but with very low light outputs.

Another problem with gallium nitride based lamps today is that in order to operate at light levels which are useful for general lighting, much higher power outputs are required. At the same time, smaller lamp sizes are required to make the lamps affordable. These are presently opposite requirements.

SUMMARY

Wide bandgap devices are formed on a diamond substrate, such as for light emitting diodes as a replacement for incandescent light bulbs and fluorescent light bulbs. In one embodiment, diodes (or other devices) are formed on diamond in at least two methods. A first method comprises growing a wide bandgap material on diamond and building devices on that grown layer. The second method involves bonding a wide bandgap layer (device or film) onto diamond and building the device onto the bonded layer. These devices may provide significantly higher efficiency than incandescent or fluorescent lights, and provide significantly higher light or energy density than other technologies. Similar methods and structures result in other wide bandgap semiconductor devices.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Gallium nitride devices are formed on a diamond substrate for light emitting diodes and white lighting as a replacement for incandescent light bulbs and fluorescent light bulbs. In one embodiment, gallium nitride diodes (or other devices) are formed on diamond in at least two methods. A first method comprises growing gallium nitride on diamond and building devices on that gallium nitride layer. The second method involves bonding gallium nitride (device or film) onto diamond and building the device onto the bonded gallium nitride. These devices are highly desirable because they are significantly higher efficiency than incandescent or fluorescent lights.

In one embodiment, the diamond substrate conducts heat so much better than any of the present substrates that the device size can be shrunk while the output power level is increased. Alternatively the same size of device may be utilized, while even further increasing the output. It might seem to be incorrect to replace an inexpensive substrate such as silicon with an expensive substrate such as diamond. However, the cost of growing a gallium nitride layer on "any substrate" is the major cost of making gallium nitride devices. Because of the reduced cost per lumen of light obtained, the use of diamond substrates may be more economical than cheaper substrates.

In a further embodiment gallium nitride and alloy lasers are built on diamond substrates. The processes may be applied for lasers as for LEDs in terms of power and cost. Applications for such lasers may include DVDs, high density optical storage, data transmission, medical diagnostics, surgery and other applications.

Nitride semiconductors are known as wide band gap semiconductors. These semiconductors generally operate at higher frequencies and power levels than conventional semiconductors and can produce light (as LED's or lasers) at higher frequencies and power levels than other semiconductor materials. In all cases, the output power level of the devices may be limited by the thermal conductivity of the device material. The highest performance could be obtained with the device having the wide band gap semiconductor intimately attached to the diamond substrate and the device layer being thin. This is best accomplished by growing a thin layer of the wide bandgap semiconductor on a single crystal diamond and then performing the device fabrication on that layer.

Crystal perfection: Some nitride devices (as well as other semiconductor devices) perform best with a semiconductor which has a high degree of crystal perfection and is not strained. In this case the method of growing a crystalline film on the diamond film will not give a highly perfect crystal nor will it give a low degree of strain (due to a large difference in thermal expansion coefficient between diamond and the semiconductor in use).

In one method for producing diamond substrates for use as substrates for nitrides (process method), a free standing diamond plate of appropriate orientation, is produced. The plate is fabricated into a semiconductor grade substrate having a highly perfect polish (with respect to flatness, smoothness, TTV) and otherwise fabricated to be compatible with semiconductor processing machinery (low thickness variation, orientation flats, etc.) In one embodiment, a surface flatness is produced which is better than one tenth wave (typically green tight) and surface smoothness of better than 1 nm or less. Such smoothness may be accomplished by appropriate polishing.

In the following steps, nitrides are attached to the diamond surface. Starting with a finished diamond substrate as described above, the surface is cleaned with solvents, acids and stored in particle free environment. Nitride devices may then be fabricated as in prior devices. The resulting nitride structure or device may then be thinned to the minimum allowable thickness. It is then attached to the diamond substrate by laying it on diamond and imparting slight movement to remove air from between the layers.

In one embodiment, thermal cycling near room temperature is used to facilitate removal of the air layer. The diamond-nitride device may then be attached to a heat sink, and operated as a device. In a further embodiment, silicon carbide on diamond is produced. A silicon carbide device may be fabricated in a normal manner as above, and attached an operated in manner the same as or similar to the nitride devices. It may then be attached and operated as above. In still further embodiments, other semiconductors may also be attached on diamond. Devices of other semiconductors such as silicon, silicon-germanium, arsenides, phosphides, antimonides, sulphides, selenides or tellurides may also be formed and bonded to diamond as described above.

Figure 8A:
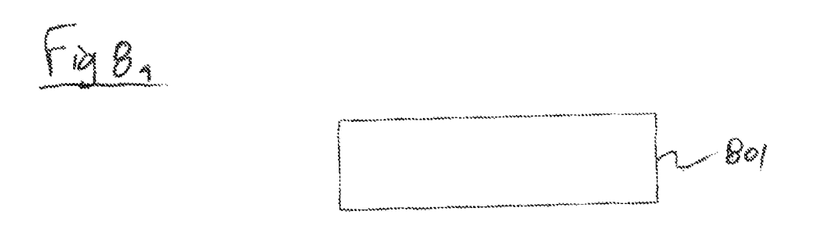
FIGS. 8a-8i illustrate a method of forming a grown diamond substrate for semiconductor fabrication, consistent with some embodiments of the invention.
Figure 8B:
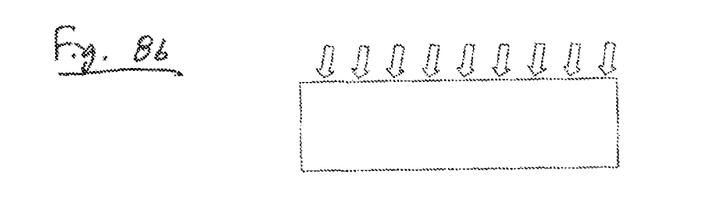
Figure 8C:
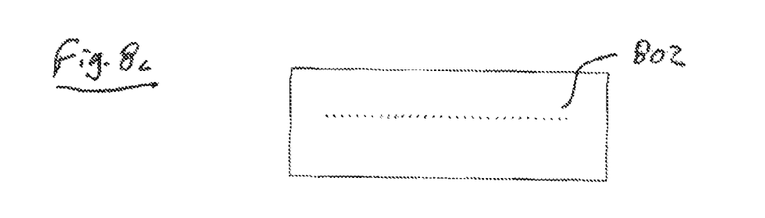
Figure 8D:
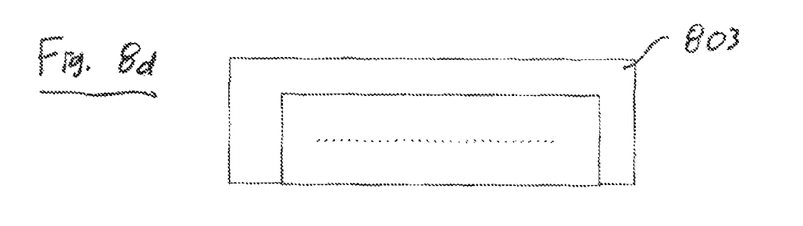
Figure 8E:
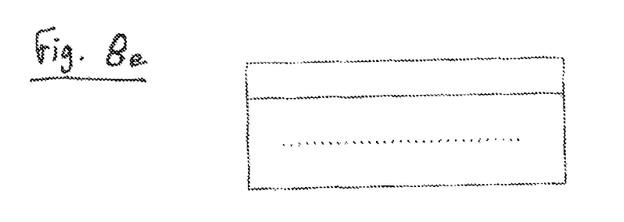
Figure 8F:
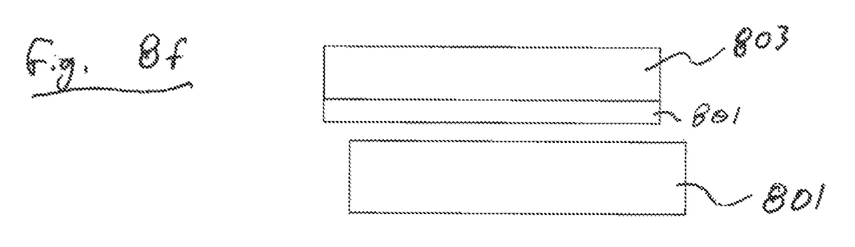

FIGS. 8a-8i illustrate an example method of producing a diamond substrate. A diamond seed crystal shown at 801 in FIG. 8a is implanted with ions such as hydrogen ($H_2$), as shown in FIG. 8b. The ion implant layer is shown at 802 in FIG. 8c. A growth layer of diamond is then grown on the assembly as shown at 803 of FIG. 8d, and the edges of the growth layer are laser trimmed as shown in FIG. 8e. The diamond seed crystal 801 and growth layer 803 are then separated at the hydrogen ($H_2$) implant layer of the seed 801 as shown in FIG. 8f, forming a somewhat smaller seed 801 and a grown diamond layer 803 having a small part of seed layer 801 attached.

Figure 8G:
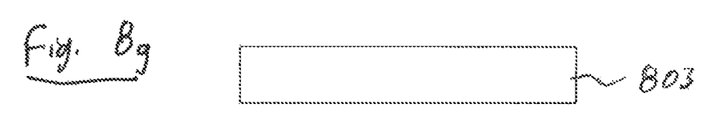
Figure 8H:
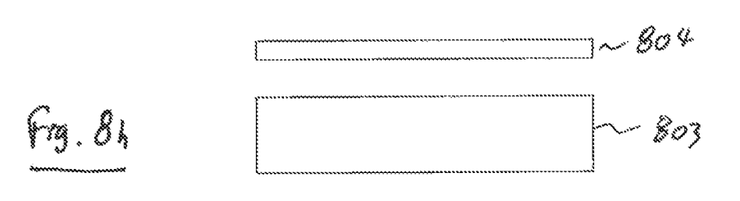
Figure 8I:
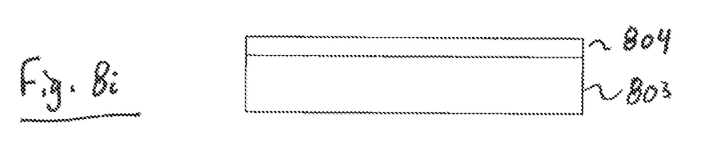

The grown diamond layer 803 shown at FIG. 8g can then be used for various semiconductor fabrication or other purposes, including attachment of a semiconductor device layer shown at 804 of FIG. 8h. The semiconductor device layer and the diamond layer are shown bonded together in FIG. 8i.

The following describes the process for producing a nitride semiconductor layer on diamond utilizing implantation and lift off. Nitride semiconductors are known as wide band gap semiconductors. These semiconductors generally operate at higher frequencies and power levels than conventional semiconductors and can produce light (as LED's or lasers) at higher frequencies and power levels than other semiconductor materials. Higher performance may be obtained with the device having the wide band gap semiconductor intimately attached to the diamond substrate and the device layer being thin. This may be accomplished by growing a thin layer of the wide bandgap semiconductor on a single crystal diamond and then performing the device fabrication on that layer.

In III-V semiconductor production, charges can be moved from one semiconductor layer to another to produce electronic properties which may not be possible to attain in a single layer of either semiconductor. In general the principle is to move charges from a wide band gap semiconductor which is highly doped to a lower band gap semiconductor which is undoped, thereby producing charges in the undoped semiconductor. Special properties and effects are also generated in the boundary layer where the two semiconductors meet. Lasers, LED's and most FET's operate using band gap engineered layers. The use of wide bandgap semiconductors such as cBN, AlN (and alloys with GaN or InN) on diamond can result in such effects in diamond and enable either n type or p type diamond layers to be produced.

In one method for producing diamond substrates for use as substrates for nitrides (process method), a free standing diamond plate of appropriate orientation is produced. The plate is fabricated into a semiconductor grade substrate having a highly polish (with respect to flatness, smoothness, TTV) and otherwise fabricated to be compatible with semiconductor processing machinery (low thickness variation, orientation flats, etc.)

Various methods may be used for producing cBN on diamond (all use the diamond substrate prepared as described above). cBN (cubic boron nitride) is a direct band gap semiconductor which is generally prepared at high temperature and pressure. It is very difficult to produce at low pressures and attempts to produce cBN have usually led to the formation of hBN (hexagonal boron nitride). The following methods may be used to produce cBN layers on diamond. The layers may be doped or undoped.

In one embodiment, direct epitaxy from plasma is utilized. In a further embodiment, phosphide conversion is utilized. This method consists of the following steps: 1. grow a layer of BP on diamond using, CVD, MOCVD or MBE. 2. Convert the BP layer by heating the substrate plus layer in ammonia to 500 to 1000 degrees centigrade, wherein the nitrogen replaces phosphorous in the lattice and (since BP is cubic) cubic boron nitride is formed. The film may be doped or undoped.

In a further embodiment, atomic layer epitaxy is used to form cBN layers on diamond. In atomic layer epitaxy, use is made of the method described in above, where BP is converted to cBN in ammonia. However, this method differs in that the conversion is done one atomic layer at a time to achieve complete conversion. It should be noted that while this may seem to be a slow process, for the necessary effects, only a few atomic layers (10 to 100) are need for most device structures. The method consists of 1. Expose diamond surface to self limiting boron source (ie $BCl_3$) such that a monolayer of $BCl_3$ attaches itself to the diamond surface in an oriented manner (temperature, etc) 2. The surface is exposed to a phosphorous containing source such as phosphine ($PH_3$), wherein the phosphorous attaches to the boron and the hydrogen extracts the chlorine leaving a layer of BP which is single crystal and oriented to the diamond substrate, 3. The surface is exposed to ammonia gas ($NH_3$) wherein the phosphorous in the BP layer is exchanged with the nitrogen in the ammonia to produce cBN layer and phosphine gas. This process is replicated the number of times required to obtain the thickness of cBN required.

In still further methods, other nitrides may be formed on diamond (process steps). Starting with finished diamond substrate as described above, it is cleaned with solvents, acids, dry plasma etchs, hot chemical etches or combinations of all. Next, a nitride film is grown in a reactor employing one of the following methods (or some as yet unreported method): hydride-halide CVD, metal organic CVD, MBE, plasma assisted MBE, chemical beam epitaxy, atomic layer epitaxy.

In one embodiment, silicon carbide is produced on diamond. Epitaxy may be used by first growing silicon carbide on suitably oriented diamond by reaction of a silicon and carbon containing gas phase as described in the literature. Conversion is then performed by exposing the diamond surface to a carbon containing gas phase at an elevated temperature. A surface layer of diamond is converted into silicon carbide by diffusion of silicon into the diamond and diffusion of carbon out of the diamond to the carbide layer.

In further embodiments, nitrides on silicon carbide on diamond are produced. A silicon carbide layer may be formed on diamond as described above. A layer of nitride is grown as described above.

In further embodiments, other semiconductors are produced on diamond. Layers of other semiconductors may be grown, such as silicon, silicon-germanium, arsenides, phosphides, antimonides, sulphides, selenides or telurides on diamond as described above.

Methods may also be used to attach an extremely thin silicon layer on diamond as described above, wherein the silicon is in the form of silicon on an insulator in which the silicon is typically a film of 500 nm or less which is attached to a thin silica layer which is in turn attached to a silicon. After the silicon is attached to the diamond by optical contacting and temperature cycling, the silica layer and the backside silicon layer are removed by selective chemical etching. Subsequently the devices are formed on the thin silicon layer.

In a further embodiment, windows are etched into the silicon so that devices can be built on the diamond to take advantage of its unique properties and provide a fully integrated silicon/diamond circuit. These methods may be used to attach other semiconductors to diamond such as GaN, GaAs, SiC, Si/Ge, and alloys of these. A range of semiconductor wafers may be bonded to diamond permitting a range of functions on the same chip. A thin silicon layer may also be bonded to a thin diamond layer and a thick silicon layer bonded to the back of the diamond layer. A thin diamond layer may be deposited in the form of nanocrystalline diamond. In still further embodiments, a large number of diamond wafers may be bonded to a large silicon wafer for the purpose of providing support and handling during device fabrication (including photolithography) of the diamond devices.

Figure 9A:
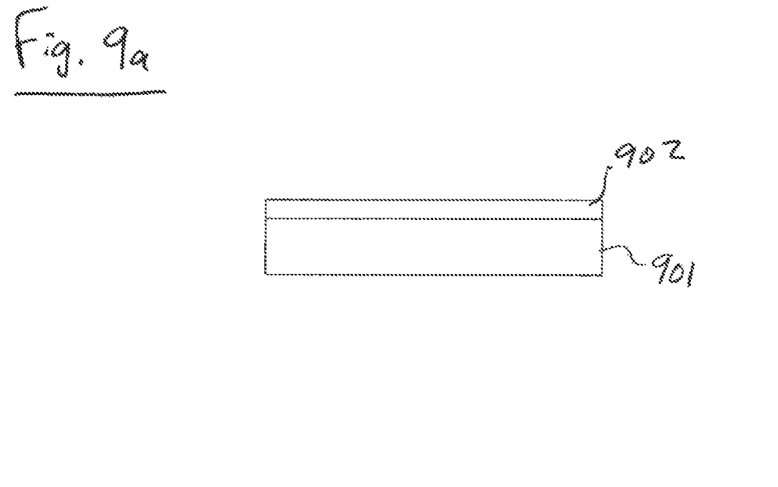
FIGS. 9a-9c illustrate a method of forming a BN semiconductor layer on a grown diamond substrate, consistent with some embodiments of the invention.
Figure 9B:
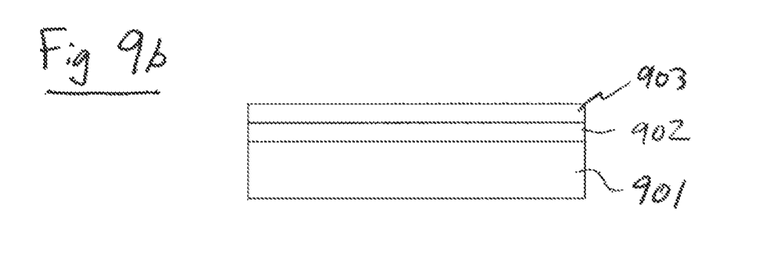
Figure 9C:
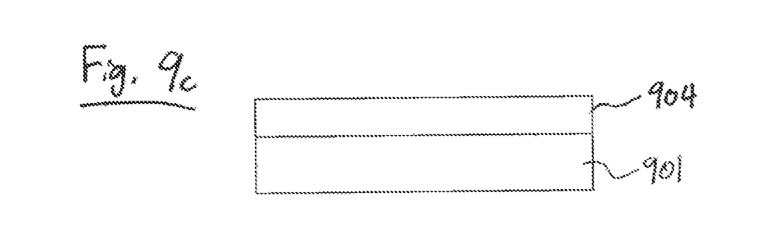

FIGS. 9a-9c show various embodiments of a grown diamond with a semiconductor layer, such as is formed in the example shown in FIG. 8. FIG. 9a shows a grown diamond substrate 901 with a semiconductor layer 902 grown on the substrate. In one embodiment, the grown layer is a $BCl_3$ atomic layer, formed by exposing the substrate 901 to $BCl_3$ as described above. The $BCl_3$ layer is then exposed to a phosphorous source such as phosphine ($PH_3$), forming a layer of BP as shown at 903 of FIG. 9c. The surface is then exposed to ammonia gas ($NH_3$) to form cBN by exchanging the phosphorous in the BP layer with nitrogen, and this process is repeated until a desired thickness layer of BN is formed as shown at 904 in FIG. 9c.

FIGS. 1-4 illustrate a method of producing a gallium nitride semiconductor device on a diamond substrate, consistent with some embodiments of the present invention. Gallium nitride (GaN) is formed on a diamond substrate layer 101, which in various embodiments is monocrystalline diamond, polycrystalline diamond, nanocrystalline diamond, synthetic diamond, or natural diamond. The gallium nitride is deposited in a layer 102 on a flat surface of the diamond.

Figure 1:
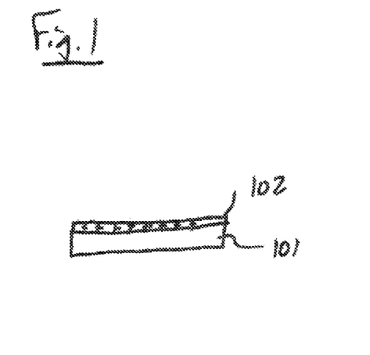
FIGS. 1-4 illustrate a method of producing a gallium nitride semiconductor device on a diamond substrate, consistent with some embodiments of the invention.

The diamond seed 101 is polished to have a flat top surface, and the edges of the seed are trimmed such as with a laser or cutting tool, and are cleaned, etched, and polished. In some embodiments, hydrogen atoms are then implanted to a desired depth. The hydrogen atoms are implanted under various conditions in various examples, but in one example are implanted at an angle of ten degrees relative to the diamond surface, and at a dose rate of approximately one microamp per square centimeter. The electrons are implanted with an energy of approximately 200 KeV, until the total dose of approximately ten to the seventeenth atoms per square centimeter are implanted into the diamond 101. In an alternate embodiment, a greater or lesser dose of hydrogen is implanted at a greater or lesser energy, such as a lesser dose implanted at a greater energy to create a relatively deep compliant layer of diamond at the polished surface. Varying the parameters of the hydrogen implant will therefore vary the depth and density of the resulting hydrogen implant layer. The hydrogen implant layer when present in diamond layers serves in some embodiments to form a compliant diamond layer having a lattice structure that is more easily able to align itself to the lattice structure of material such as gallium nitride grown on the diamond.

If the gallium nitride layer is formed on a compliant layer of monocrystalline diamond, the lattice structure of the gallium nitride can be made to substantially line up with the lattice structure of the compliant diamond layer, resulting in monocrystalline or large crystalline gallium nitride. In other embodiments where polycrystalline diamond or nanocrystalline diamond are used for substrate material, the gallium nitride will tend to form smaller crystal structures, aligning locally with the lattice structure of the diamond substrate. In some embodiments, single crystal diamond is preferred for its superior thermal conductivity, and because growth of gallium nitride on monocrystalline diamond results in the most uniform gallium nitride growth.

Growth on the diamond substrate can occur on any crystal orientation of the diamond, such as the 100 plane, the 110 plane, or the 111 plane. In one embodiment the 111 plane is preferred due to the symmetry it shows. Although a 111 diamond plane surface is sometimes more difficult to manufacture, the symmetry in three dimensions aligns more readily with the gallium nitride crystal structure, resulting in a preferred crystal junction structure.

Figure 2:
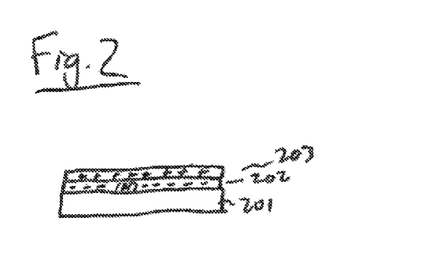
Figure 5:
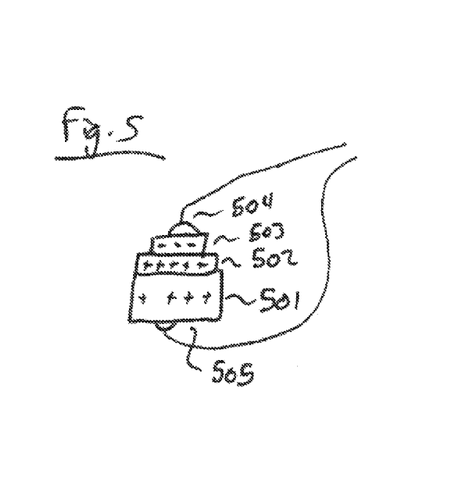
FIG. 5 illustrates a gallium nitride semiconductor device formed on a diamond substrate having a lattice doped with boron, making the diamond lattice a p-type semiconductor, consistent with some embodiments of the invention

In FIG. 2, a diamond substrate 201 and a first layer of n-type or n-doped gallium nitride are used as a base for growth of a layer of p-type gallium nitride 203. The p-type and the n-type layers are in other embodiments inverted or grown in reverse order, such as is shown in the device of FIG. 5. Various doping materials can be used for both p-type and n-type material, including boron, phosphorous, and other such materials. For example, p-type gallium nitride can be made by doping the gallium nitride with boron, which has only three valence electrons, making the diamond a strongly p-type semiconductor material. The absence of electrons in sites in the gallium nitride material that contain boron leaves a "hole" that is receptive to electrons, making what is in effect a mobile positive charge. The negatively charged boron atom is fixed in the crystal lattice, meaning that the boron atoms cannot move, but contribute holes as electron receptors to the electrical conduction process. Doping with other materials having valence electrons or holes will create n-type or p-type material, depending on the number of valence electrons of the dopant.

Figure 3:
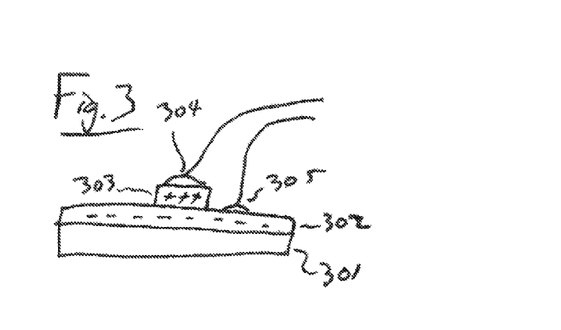

In FIG. 3, the structure of FIG. 2 is masked and ached to form a small isolated region of the positively doped gallium nitride layer at 303, and an electrical contact is formed at 304 providing a means of connecting an external electronic circuit to the formed semiconductor device. Similarly, an electrical contact is formed at 305 on the negatively doped gallium nitride layer 302, also providing an external electrical contact to another portion of the formed semiconductor device. The diamond substrate 301 now serves as a heat sink, and may be a substrate for one or more other semiconductor devices, such as in an integrated circuit.

Figure 4:
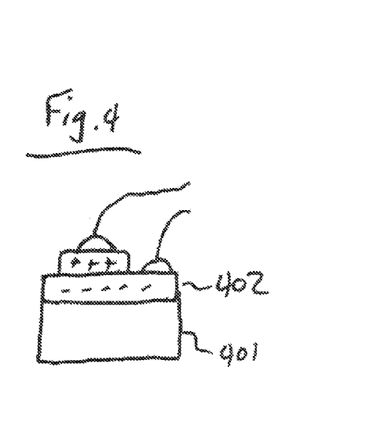

FIG. 4 shows isolation of the device formed in FIG. 3, where the sides of diamond substrate 401 and n-type gallium nitride layer 402 are trimmed to form a single device, such as the diode shown here, that is individually packaged. In a further embodiment, the diamond layer 401 is coupled to another heat conductor, such as to a metal heat sink or a diamond heat sink, which wilt in some embodiments be a part of the package for the semiconductor device shown.

If the diamond is a doped diamond or is a conducting diamond, it may form a part of the semiconductor, as is shown in FIG. 5. In FIG. 5, the diamond lattice is doped with boron, making the diamond lattice up-type semiconductor. In some examples, the boron is grown into the diamond as the diamond is formed by chemical vapor deposition, or is incorporated by another process, while other examples use diffusion or ion implantation to implant boron into diamond, whether the diamond is synthetic or naturally occurring.

In some embodiments, diamond regions having boron or other dopants implanted will have somewhat larger or smaller lattice structures than undoped diamond or other material such as gallium nitride as a result of placement of the dopant within the diamond crystal structure. The lattice mismatch between diamonds having different doping concentrations or between doped and undoped diamonds or other crystal structures such as gallium nitride is controlled in some embodiments by implantation of ions selected to give the desired lattice structure. For example, a lightly boron-doped diamond region will have a lattice structure somewhat expanded relative to undoped diamond made from primarily carbon-12. Adding carbon-13 to the boron-doped diamond shrinks the lattice structure, and is used in some embodiments to eliminate the lattice mismatch between diamond layers or to control the lattice mismatch or strain between diamond layers.

The boron-doped diamond structure of FIG. 5 will therefore in some embodiments use carbon-13 or other dopants to alter the lattice structure, or will use hydrogen implantation alone or in addition to dopants to provide a desired lattice structure with a degree of compliance provided by the hydrogen implantation.

A layer of p-type gallium nitride is formed on the boron-doped diamond substrate 501 as shown at 502. An n-type layer of gallium nitride is formed at 503 on top of the p-type gallium nitride layer and the device is trimmed, much as the device of FIG. 4. A metal contact 504 is connected to the n-type gallium nitride, and a second metal contact 505 is coupled to the p-type conductive diamond at 505. The diode that is formed thereby is similar to the diode of FIG. 4, but relies on the diamond to conduct electricity as part of the semiconductor device formed rather than simply as a heat sink.

Figure 6:
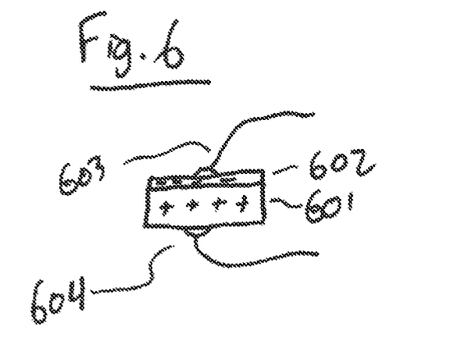
FIG. 6 illustrates use of boron-doped diamond as a p-type semiconductor material and other dopants such as gallium nitride to form n-type semiconductor material to form basic semiconductor devices such as diodes, consistent with some embodiments of the invention.

Because boron-doped diamond can be used as a p-type semiconductor material and other dopants can be used to form n-type semiconductor material, diamond and a single layer of gallium nitride can form basic semiconductor devices such as diodes, as is shown in FIG. 6. The boron-doped p-type diamond is shown at 601, and has a layer of gallium nitride that is n-type doped grown on a surface as shown at 602. Attachment of a conductor at 603 to the n-type gallium nitride and attachment of an electrical conductor at 604 to the p-type diamond at 604 forms a diode, which utilizes the diamond layer both as a heat sink as an electrical conductor forming a part of the diode semiconductor.

Figure 7:
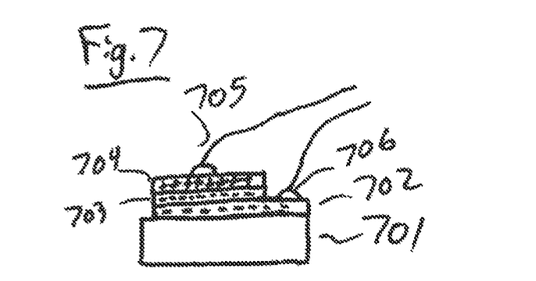
FIG. 7 illustrates formation of a heterojunction structure by a material having a suitable bandgap inserted in a semiconductor structure, consistent with some embodiments of the invention.

In another embodiment, a heterojunction structure is formed by a material having a suitable bandgap inserted in a semiconductor structure such as is shown in FIG. 7. A diamond substrate 701 serves as a base and as a heat sink to the semiconductor device, formed by depositing an n-type doped gallium nitride layer 702. A heterojunction layer 703 is formed thereon, such as by formation of a more heavily doped n-type gallium nitride layer. A p-type layer such as p-type gallium nitride is formed on the heterojunction layer, as is shown at 704, and is coupled to electrical contact 705. A second electrical contact 706 is coupled to the first, more weakly n-type gallium nitride layer 702, to form a heterojunction diode. The diode shown is capable of operating at a relatively high speed, due to the heterojunction structure formed, and at a relatively high power due to the heat sink effect provided by the diamond substrate 701.

Figure 10:
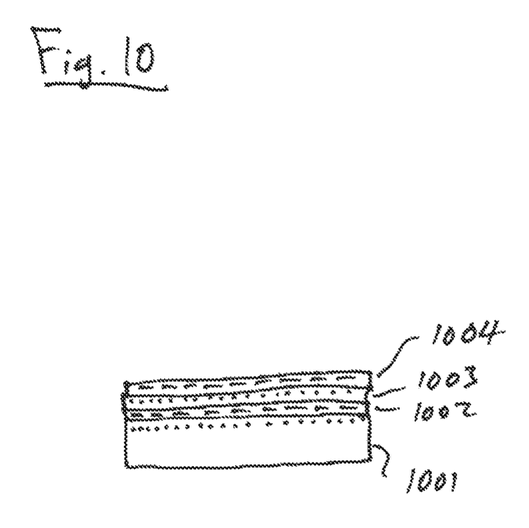
FIG. 10 illustrates a method of forming alternating diamond layers implanted with hydrogen and GaN, consistent with some embodiments of the invention.

FIG. 10 shows another embodiment of a GaN on diamond structure. Here, a diamond substrate 1001 is implanted with hydrogen to form a top compliant layer. A layer of p or n doped GaN grown on the $H_2$ implanted diamond substrate (shown as n-doped) at 1002. A second layer of diamond is grown on the layer of p or n doped GaN, the second layer of diamond implanted with hydrogen as shown at 1003. A second layer of n or p doped GaN grown on the second layer of diamond (shown as n-doped) at 1004.

In alternate embodiments, the n-type and p-type dopants are reversed, forming a diode having anode and cathode electrical connections opposite what is shown in FIG. 7. In still further embodiments, the basic device illustrated here, such as the diode of FIG. 6, the heterojunction of FIG. 7, and the diodes of FIGS. 4 and 5 have their dopants reversed, and may further be a part of a larger semiconductor structure such as a bipolar junction transistor. In still further embodiments, field-effect transistors are formed using methods and structures similar to those described here.

In some heterostructures, such as heterostructures of gallium nitride, aluminium nitride, indium nitride, alloys thereof, and other such materials, depositing on a doped diamond such as p-type diamond will create a superior p-n junction, such as p-type diamond from which acceptors or holes diffuse from the p-type diamond into the gallium nitride or other heterojunction material, providing both a superior p-n junction and a junction that has the thermal benefit of a diamond heat sink as a part of or in close contact with the semiconductor junction.

In still further embodiments, one or more of the semiconductor device layers in the devices shown here are replaced by other semiconductor materials, such as gallium arsenide, aluminium gallium arsenide, indium phosphide, indium nitride, boron nitride, or other such materials to form boron nitride semiconductor devices, such as diodes, transistors, heterojunction semiconductor devices, light-emitting diodes, electron emitters, or other semiconductor devices.

The semiconductor devices formed are in some embodiments "grown" onto the diamond structure by chemical vapor deposition, by metal organic chemical vapor deposition, by molecular beam epitaxy, or simply by optical coupling. Optical coupling is here defined as producing a surface that is optically flat on both pieces of material to be coupled, such that placing them in contact with one another results in coupling of the two materials. In some further embodiments, heating or annealing the optically coupled materials results in evacuation of trapped air or gases, and in greater uniformity of the lattice structures of the coupled materials.

This optical contact enhances the ability of the diamond to conduct heat away from the coupled material, enabling a semiconductor device so coupled to a diamond to operate at greater power than otherwise possible. It is therefore desirable that the diamond in some embodiments be formed to have a particularly high thermal conductivity. For example, diamonds having a greater than average purity of carbon-12 and a corresponding reduced concentration of carbon-13 isotopes are known as isotopically enhanced, and are particularly thermally conductive. This makes them well-suited for applications such as semiconductor device fabrication, enabling higher power and higher density than can otherwise be achieved. Isotopic enhancement of the diamond CVD precursor gases with carbon-12 can result in a diamond having significantly less than the typical 1.1% carbon-13 concentration, resulting in thermal conductivity as high as 3300 W/mK.

Other examples of methods of producing synthetic diamond with high thermal conductivity include growing diamond in a low nitrogen environment, growing synthetic diamond in an environment rich in hydrogen, and using boron doping resulting in an increase in thermal conductivity. The diamonds used will in some embodiments have a thermal conductivity greater than at least 2500 w/mK, 2700 W/mK, or 3200 W/mK, and will be isotopically enhanced with carbon-12 such that the resulting carbon-13 concentration in the bulk of the diamond is less than 1%, 0.1%, or 0.01%. In another embodiment, the nitrogen concentration within the diamond is less than 50 ppm, 10 ppm, or 5 ppm, resulting in a diamond structure that is significantly more thermally conductive than typical natural diamond.

Diamond semiconductor devices produced by such methods will in some embodiments provide a significantly higher energy density, and produce significantly higher light output per unit area or volume, than can be realized using previous technologies. Reduction in physical size of light-producing diamond semiconductors also reduces the number of devices needed to produce a desired output, leading to a reduction in wiring and complexity in implementing diamond semiconductors to produce a light device. It is anticipated that light emitting diode applications and other applications of the diamond semiconductor technologies presented herein will enable production of smaller, brighter, more efficient lighting than can currently be produced, making such technologies important to a wide range of industrial and consumer uses.

It is anticipated that the methods and devices described here will apply not only to the specific semiconductor structures shown and described herein, but to other semiconductors, integrated circuits, and electronic devices. Although specific embodiments have been illustrated and described herein, those of ordinary skill in the art will appreciate that a variety of arrangements which are calculated to achieve the same purpose may be substituted for the specific embodiments shown. This application is intended to cover any adaptations or variations of the invention. It is intended that this invention be limited only by the claims, and the full scope of equivalents thereof.

What is claimed is:

1. A method comprising:
   implanting ions in a diamond substrate to provide a top compliant layer to form a top compliant surface on the diamond substrate; and
   bonding a layer of wide bandgap material on the top compliant surface of the ion implanted diamond substrate such that the compliant layer reduces a lattice mismatch between the substrate and the layer of bonded wide bandgap material.

2. The method of claim 1 wherein the wide bandgap material comprises cubic boron nitride.

3. The method of claim 1 wherein the wide bandgap material comprises GaN.

4. The method of claim 2 wherein bonding the layer of cubic boron nitride to the top compliant surfaces is done using optical bonding.

5. The method of claim 1 wherein the implanted ions comprise hydrogen ions.

6. The method of claim 1 wherein the implanted ions comprise boron ions.

7. The method of claim 1 and further comprising forming a device in the layer of wide bandgap material.

8. The method of claim 1 wherein the diamond substrate comprises polycrystalline diamond.

9. The method of claim 1 wherein the diamond substrate comprises single crystalline chemical vapor deposition formed diamond.

10. A method comprising:
    forming a top compliant layer in an ion implanted diamond substrate to form a top compliant surface on the diamond substrate; and
    bonding a layer of cubic boron nitride on the top compliant surface of the ion implanted diamond substrate such that the compliant layer reduces a lattice mismatch between the substrate and the layer of bonded cubic boron nitride material.

11. The method of claim 10 wherein bonding the layer of cubic boron nitride to the top compliant surfaces is done using optical bonding.

12. The method of claim 10 wherein the wide bandgap material is cubic boron nitride, and further comprising forming a device in the layer of cubic boron nitride.

13. The method of claim 10 and further comprising conductively doping at least a portion of the diamond substrate.

14. The method of claim 13 wherein the wide bandgap material is cubic boron nitride, and further comprising using layer of cubic boron nitride with the doped diamond substrate to form a device.

15. A method comprising:
    implanting hydrogen ions in a diamond substrate to provide a top compliant layer to form a top compliant surface on the diamond substrate; and
    bonding a layer of cubic boron nitride on the top compliant surface of the hydrogen implanted diamond substrate such that the compliant layer reduces a lattice mismatch between the substrate and the layer of cubic boron nitride.

16. The method of claim 15 wherein bonding the layer of cubic boron nitride to the top compliant surfaces is done using optical bonding.

17. The method of claim 15 wherein the concentration of hydrogen ions is between approximately $8 \times 10^{16}$ to $10^{17}$ atoms per cubic centimeter.

18. The method of claim 15 wherein the hydrogen ions are implanted with an energy ranging from 50 KeV to 1 MeV.

19. The method of claim 15 wherein the diamond is a monocrystalline diamond.

20. The method of claim 19 wherein the diamond compliant layer has a 111 crystalline orientation.

21. A method comprising:
- implanting $H_2$ in a diamond substrate to provide a top compliant layer;
- bonding a layer of p or n doped cubic boron nitride on the $H_2$ implanted diamond substrate;
- growing a layer of diamond on the layer of p or n doped cubic boron nitride;
- implanting $H_2$ in the grown diamond layer; and
- growing a layer of n or p doped cubic boron nitride on the $H_2$ implanted grown diamond layer.

* * * * *